(12) United States Patent
Sheng et al.

(10) Patent No.: US 7,400,206 B2
(45) Date of Patent: Jul. 15, 2008

(54) CLOCK CIRCUIT WITH PROGRAMMABLE LOAD CAPACITORS

(75) Inventors: Wenjung Sheng, Austin, TX (US); Shyam S. Somayajula, Austin, TX (US); Xue-Mei Gong, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 97 days.

(21) Appl. No.: 11/089,857

(22) Filed: Mar. 24, 2005

(65) Prior Publication Data

US 2006/0214738 A1    Sep. 28, 2006

(51) Int. Cl.
*H03B 5/12*    (2006.01)
(52) U.S. Cl. .................. 331/36 C; 331/108 C; 331/185
(58) Field of Classification Search ................ 331/185, 331/186, 108 C, 36 C
See application file for complete search history.

(56) References Cited

U.S. PATENT DOCUMENTS

| 4,617,473 | A | | 10/1986 | Bingham ...................... 307/66 |
| 5,517,153 | A | | 5/1996 | Yin et al. ..................... 327/546 |
| 5,546,055 | A | * | 8/1996 | Klughart ............... 331/116 FE |
| 5,901,103 | A | * | 5/1999 | Harris et al. ................. 365/226 |
| 6,424,229 | B1 | * | 7/2002 | Justice et al. ................... 331/4 |
| 6,788,159 | B2 | * | 9/2004 | Takahashi et al. ........... 331/176 |
| 6,950,491 | B1 | * | 9/2005 | Fernald ........................ 377/48 |
| 7,154,341 | B2 | * | 12/2006 | Yamamoto et al. ............. 331/2 |
| 2005/0007205 | A1 | * | 1/2005 | Bridger .................. 331/108 C |
| 2006/0218417 | A1 | | 9/2006 | Sheng et al. ................. 713/300 |

FOREIGN PATENT DOCUMENTS

| WO | WO 00/38338 | 6/2000 |
| WO | WO 02/073562 | 9/2002 |

OTHER PUBLICATIONS

U.S. Appl. No. 60/608,966, filed Sep. 30, 2004 entitled "Controlling the Frequency of an Oscillator" by James P. Maligeorgos and Donald A. Kerth.
PCT/US2006/010472 International Search Report with Written Opinion of the International Searching Authority, mailed Nov. 24, 2006.

* cited by examiner

*Primary Examiner*—Robert J. Pascal
*Assistant Examiner*—Levi Gannon
(74) *Attorney, Agent, or Firm*—Trop, Pruner & Hu, P.C.

(57) ABSTRACT

In one embodiment, the present invention includes methods and apparatus for providing initial control values to programmable load capacitors of an oscillator, such as that of a real time clock circuit. Using the initial values, the real time clock circuit may begin operation, enabling additional circuitry within an integrated circuit to begin operation. This additional circuitry may cause operating values to program the load capacitors to provide a desired reference clock based on a given system's requirements.

16 Claims, 5 Drawing Sheets

CLOCK CIRCUIT WITH PROGRAMMABLE LOAD CAPACITORS

FIELD OF THE INVENTION

The present invention relates to integrated circuits (ICs), and more particularly to clock circuits.

BACKGROUND

Clock circuits are used in many analog ICs to provide reference clock signals. One particular type of clock circuit is a real time clock (RTC). An RTC is used to provide a reference clock, and can also be used to provide real time clock functions (i.e., date and time functions). An RTC typically includes an analog portion and a digital portion. The analog portion typically includes an oscillator and buffer circuitry, while the digital portion typically includes digital counters for implementing the real time functions.

Typically, the oscillator of the analog portion of a real time clock is a crystal oscillator that uses load capacitors to generate a desired oscillation frequency. The value of the load capacitors may vary, depending on a crystal chosen for use in a system. Accordingly, load capacitors are typically implemented using off-chip capacitors, increasing component counts, as well as consuming valuable board area.

Because an RTC is used to provide real time clock functions, it must always be supplied power, even when remaining portions of the IC (and even the system in which it is contained) is powered off. Accordingly, an RTC needs to operate at very low power consumption levels and it typically runs on a backup power supply, such as a coin cell battery or the like. To conserve power in this backup power supply, some systems switch to provide power to the RTC from a main power supply when available. However, such switching schemes are complex and inefficient, and consume additional power.

A need thus exists to provide more flexibility in the use of load capacitors, as well as to reduce power consumed by a back up power supply.

SUMMARY OF THE INVENTION

In one embodiment, the present invention includes a method for obtaining a clock signal, such as a reference clock signal, for use in an integrated circuit (IC). The method may be implemented using an oscillator to generate the clock signal, where the oscillator is a crystal-based or other type of oscillator. First, an initial value may be provided for load capacitors of the oscillator while a remaining portion of an associated IC is not operating. Using the initial value, the oscillator may generate a first clock signal. Then, an operating value for the load capacitors may be set using the associated IC after it is powered up. Using the operating value, the oscillator may then generate the desired clock signal. In some embodiments, a real time clock may be controlled to provide the reference clock.

Other embodiments may be implemented in an IC and may include analog and digital circuitry to form a real time clock. The analog portion may have programmable load capacitors and the digital portion may be used to provide an initial control signal to the programmable load capacitors upon power up of the real time clock. In such manner, the real time clock can provide a clock signal to enable additional circuitry of the IC to be powered on. Once this additional circuitry is powered on, the load capacitors may then be provided with an operating control signal to enable a target reference clock frequency to be obtained. In some embodiments, the programmable load capacitors may be fabricated on the IC itself, reducing component counts and board size.

Embodiments of the present invention may be implemented in appropriate hardware, firmware, and software. To that end, one embodiment may be implemented in an integrated circuit having both analog and digital circuitry, including a clock circuit and digital control circuitry for the clock circuit. Still other embodiments may include a system including such an integrated circuit along with additional components, such as a host processor, memory, input/output devices and the like.

In one embodiment, the system may be a wireless device such as a cellular telephone handset, personal digital assistant (PDA) or other mobile device. Such a system may include a transceiver including a clock circuit as described above, as well as digital circuitry to provide control signals to the clock circuit. The digital circuitry may include a baseband processor. The transceiver may include programmable load capacitors, in some embodiments. The system may further include a host processor coupled to the transceiver.

DETAILED DESCRIPTION

Figure 1:
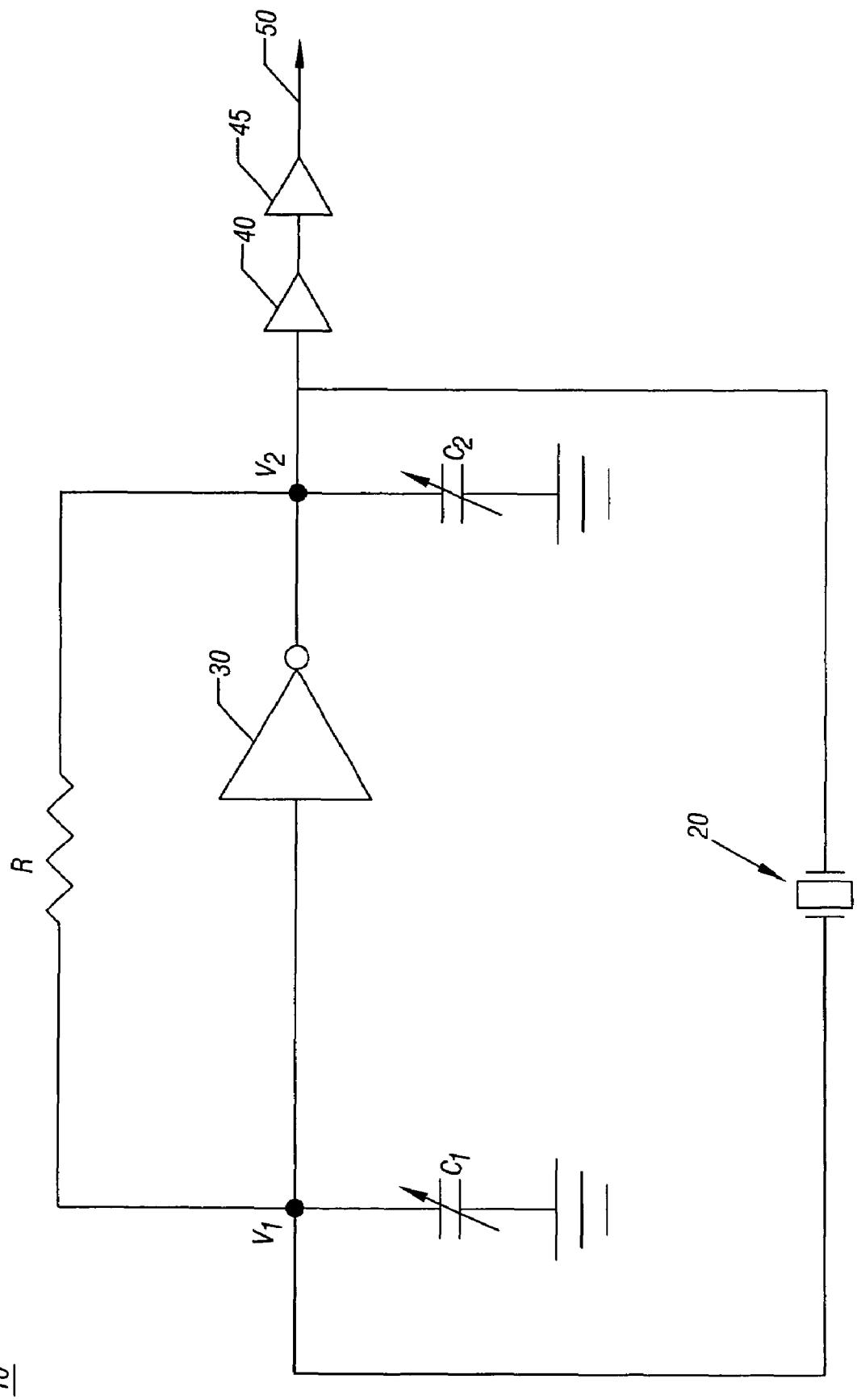
FIG. 1 is a block diagram of an analog clock circuit in accordance with one embodiment of the present invention.

Referring now to FIG. 1, shown is a block diagram of a clock circuit 10 in accordance with one embodiment of the present invention. More specifically, clock circuit 10 is an analog portion of a real time clock (RTC) circuit. While described herein as a real time clock circuit, it is to be understood that the scope of the present invention is not so limited and that analog clock circuit 10 may take other forms. In various embodiments, analog clock circuit 10 may be implemented in an integrated circuit (IC) such that virtually all of the components of analog clock circuit 10 are on chip, thus reducing cost and board area.

As shown in FIG. 1, analog clock circuit 10 may take the form of a crystal oscillator, such as a Colpitts oscillator although other oscillator types are possible. Analog clock circuit 10 includes a crystal 20 which may be coupled at nodes $V_1$ and $V_2$ to load capacitors $C_1$ and $C_2$. In various embodiments, load capacitors $C_1$ and $C_2$ may be on-chip capacitors formed as metal-oxide-semiconductor (MOS) capacitors. Furthermore, load capacitors $C_1$ and $C_2$ may be programmable such that analog clock circuit 10 may be used by various end users having different crystal requirements. For example, different system manufacturers, such as the makers of cellular telephones, personal digital assistants (PDA) or other such systems, may design in an IC in accordance with an embodiment of the present invention to operate with different crystal types and/or at different oscillation frequencies. As such, load capacitors $C_1$ and $C_2$ may be set at different capacitor values depending on the system in which they are installed. As further shown in FIG. 1, analog clock circuit 10 further includes a resistor R coupled between nodes $V_1$ and $V_2$, along with an amplifier 30.

The oscillator frequency of analog clock circuit 10 may be set using load capacitors $C_1$ and $C_2$. For purposes of extracting a reference signal (which may be a sinusoidal signal) from clock circuit 10, the signal may be taken either from node $V_1$ or $V_2$, or some combination of the voltages from these nodes. In the embodiment shown in FIG. 1, node $V_2$ is chosen to provide the reference signal. Accordingly, in the design shown, the voltage output at node $V_2$ may be buffered by buffers 40 and 45 and provided out of analog clock circuit 10 as a reference clock 50. Reference clock 50 may be used as a system clock directly, or it may be further processed to obtain one or more different clocks used in operation of a system.

Crystal 20 may be modeled using an electrical model. More specifically, a given crystal resonator may be modeled as a capacitor and an inductor coupled in series between the terminals of the crystal. This electrical model also includes a capacitor that is connected in parallel to the series combination of the capacitor and the inductor, and is thus connected between the terminals of the crystal. Accordingly, the fundamental mode of oscillation of analog clock circuit 10 that includes crystal 20 is that of a series resistance inductance capacitance (RLC)-type oscillator in which a large sinusoidal current I flows through load capacitors $C_1$ and $C_2$ and crystal 20. The $V_1$ voltage is described by the following equation:

$$V_1 = \frac{I}{sC_1}. \qquad [\text{Eq. 1}]$$

The $V_2$ voltage is described by the following equation:

$$V_2 = \frac{I}{sC_2}. \qquad [\text{Eq. 2}]$$

For embodiments of the invention in which the $V_2$ voltage is taken as the reference signal, any step change in the capacitance $C_2$ results in a step change in the $V_2$ voltage, when it is assumed that the amplitude of the I current remains constant. The I current, in fact, remains relatively constant in amplitude because the bulk of the I current that flows through crystal 20 ends up flowing through the inductor in the model of crystal 20.

Figure 2:
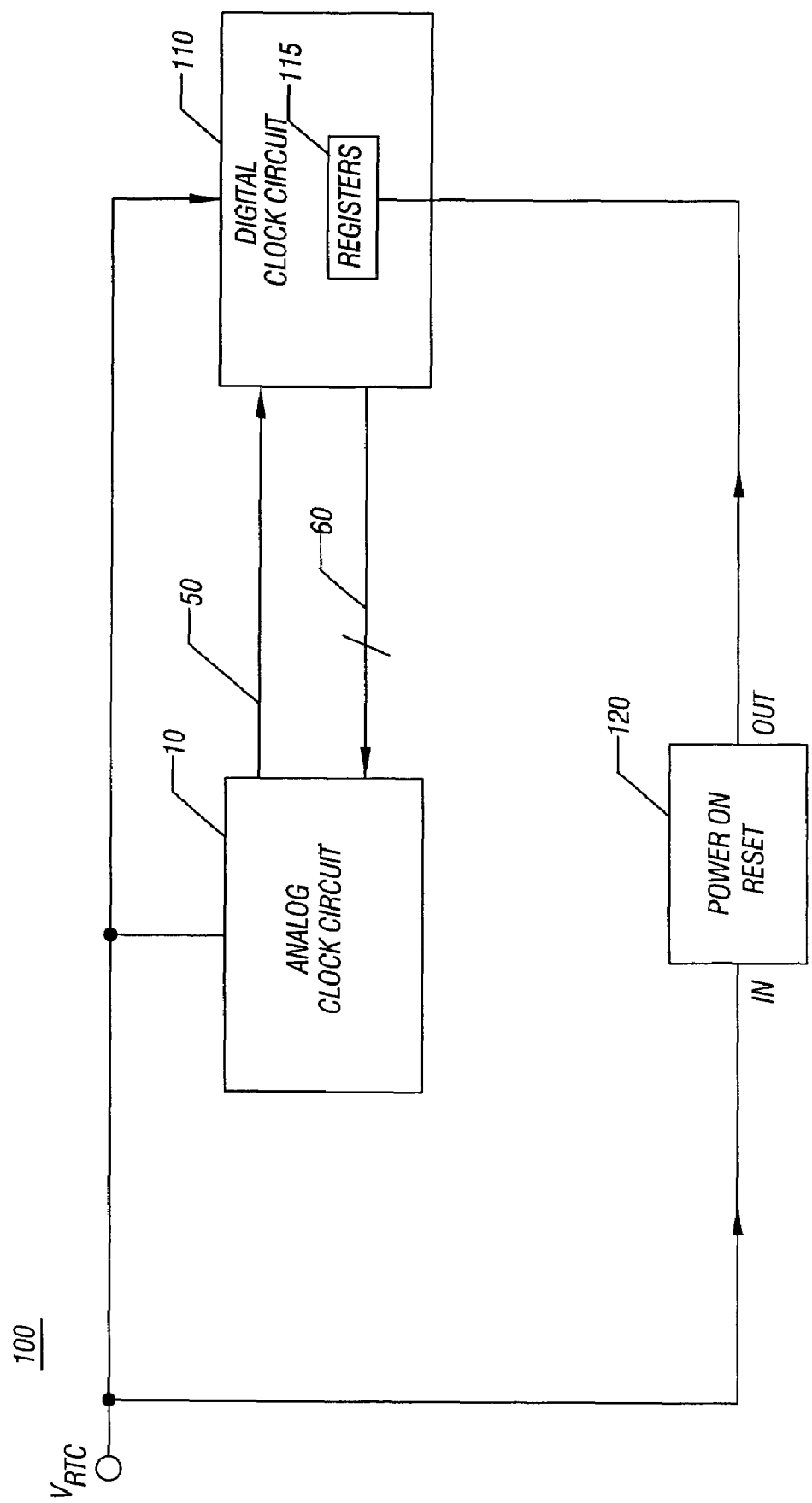
FIG. 2 is a block diagram of a clock circuit in accordance with one embodiment of the present invention that includes the analog clock circuit of FIG. 1.

Referring now to FIG. 2, shown is a block diagram of a clock circuit 100 that includes analog clock circuit 10. More specifically, clock circuit 100 may be a real time clock, although the scope of the present invention is not so limited. As shown in FIG. 2, analog clock circuit 10 provides reference clock 50 that is coupled to a digital portion 110. Digital portion 110 provides control signals 60 to analog clock circuit 10 to control the frequency of oscillation.

That is, in embodiments in which load capacitors are implemented on-chip, they may be programmable so that clock circuit 100 may provide a desired reference clock using different types of associated crystals. In such manner, different customer's requirements (e.g., with respect to crystal selection and reference clock frequency) may be met. Furthermore, in embodiments in which clock circuit 100 is an $RTC_1$ it is to remain in operation even when other blocks of an IC including clock circuit 100 are not operating. For this reason, in various embodiments values corresponding to control signals 60 may be stored in digital portion 110. As will be discussed further below, digital portion 100 may store an initial value for control signals 60 that may then be later updated by system software when system software begins operation.

Specifically, registers 115 within digital portion 110 may store a control value for load capacitors $C_1$ and $C_2$ of analog clock circuit 10. As an example, a plurality of registers 115 may be present in digital portion 110, each of which may store a single bit to be used in controlling the load capacitors. In one embodiment, registers 115 each may be a storage device such as a D-type flip-flop, although the scope of the present invention is not so limited. Digital portion 110 may include additional registers that perform other functions, such as real time clock functions. Furthermore, other registers and logic within digital portion 110 may be used to receive reference clock 50 and provide the reference clock and/or processed variations of the clock to other circuitry to which clock circuit 100 is coupled.

In one embodiment, three registers 115 may be included in digital portion 110 and may each provide a single bit value to analog clock circuit 10 via control signals 60. In turn, control signals 60 may be used in analog clock circuit 10 to control the capacitance of load capacitors $C_1$ and $C_2$, as will be described further below.

As further shown in FIG. 2, a power on reset circuit 120 is coupled to receive an operating voltage (i.e., $V_{RTC}$) and to generate a reset signal that is provided to digital portion 110. More specifically, the reset signal is provided to registers 115 of digital portion 110, as will be discussed further below. Also shown in FIG. 2, analog clock circuit 10 and digital portion 110 are also coupled to receive the supply voltage, $V_{RTC}$. As will be discussed further below, the supply voltage may be provided by a main power supply or an auxiliary power supply.

In embodiments in which clock circuit 100 is a real time clock, the circuit 100 is typically the first block on an IC to begin operation and furthermore it remains in operation while all other blocks on the chip are powered down. Accordingly, the load capacitors (within analog portion 10) may be controlled to have an initial value upon initial powering of clock circuit 100 (i.e., before a remainder of the IC is powered on), so that a reference clock can be generated. In various embodiments, programming the initial capacitor values may be performed upon initial powering by a main power supply. Thus, on initial powering up of clock circuit 100, registers 115 may be set with an initial value that is provided as control signals 60 to analog clock circuit 10 to allow it to begin oscillating and provide a reference clock. When the reference clock is provided to digital portion 110 (and other blocks of a system), additional system functionality can occur.

In one embodiment, on first powering of clock circuit 100 (i.e., by application of $V_{RTC}$) registers 115 may store initial values to enable initial programming of load capacitors $C_1$ and $C_2$. In one embodiment, power on reset circuit 120 may generate a reset signal that can be used to set initial register values for registers 115. To provide this ability, power on reset circuit 120 may include delay circuitry such that its output is delayed by a short time from its receipt of the supply voltage (i.e., $V_{RTC}$). For example, in one embodiment power on reset circuit 120 may include a resistor-capacitor (RC) circuit to provide a short delay between receipt of the supply voltage and output of the reset signal. This delay allows the supply voltage to be received by digital portion 110, and to power up registers 115. While the time delay may vary, in some embodiments a delay of between approximately 5 microseconds (µs) and 100 µs may be provided.

In one embodiment, registers 115 may store a value of zero upon receipt of the reset signal. These zero values may then be sent via control signals 60 to analog clock circuit 10. In such an embodiment, the initial values provided by registers 115 on control signals 60 may cause load capacitors $C_1$ and $C_2$ to be set to a capacitance of between approximately 2.0 and 5.0 picoFarads (pF), although the scope of the present invention is not so limited. Furthermore, while a single set of control signals and decode logic may be used to control both load capacitors $C_1$ and $C_2$, it is to be understood the scope of the present invention is not so limited, and different values (generated by different registers and different decode logic) may be separately generated to select desired capacitances for capacitors $C_1$ and $C_2$.

Based on the initial register values it receives, analog clock circuit 10 can begin oscillating and provide reference clock 50 to digital portion 110. Digital portion 110 may then provide the reference clock to other circuitry within a system in which it is included, both on the same chip, as well as to off-chip components. As an example, the reference clock may be provided to an on-chip baseband processor (not shown in FIG. 2) to enable additional steps in a power on process to be performed.

As part of such a power on process, which may be implemented using software such as a basic input/output system (BIOS) or other such startup software, the baseband processor may cause registers 115 to be written with an operating value that is different from the initial value. Thus the operating value may be selected and provided to registers 115 using software (or a combination of software, firmware and hardware) that may be executed within a system, such as a wireless system or other device using clock circuit 100. The operating value may be retained by registers 115 so long as a supply voltage from either a main power supply or a backup power supply is active. If power from both sources is lost, the operating value stored in registers 115 may be lost, and upon a next power on by the main power supply, the capacitor programming may be repeated to select a desired capacitance. Such embodiments may include an article in the form of a machine-readable storage medium onto which there are stored instructions and data that form a software program to perform such methods.

In an example embodiment, registers 115 may be rewritten with operating values that correspond to a desired capacitance for load capacitors $C_1$ and $C_2$ for a given system in which the real time clock is to be included. In turn, registers 115 may provide the operating values as control signals 60 to enable analog circuit 10 to select the desired capacitances, causing the desired oscillation frequency to be attained. In one embodiment, reference clock 50 may be set to operate at 32.768 kHz, although the scope of the present invention is not so limited.

Figure 3:
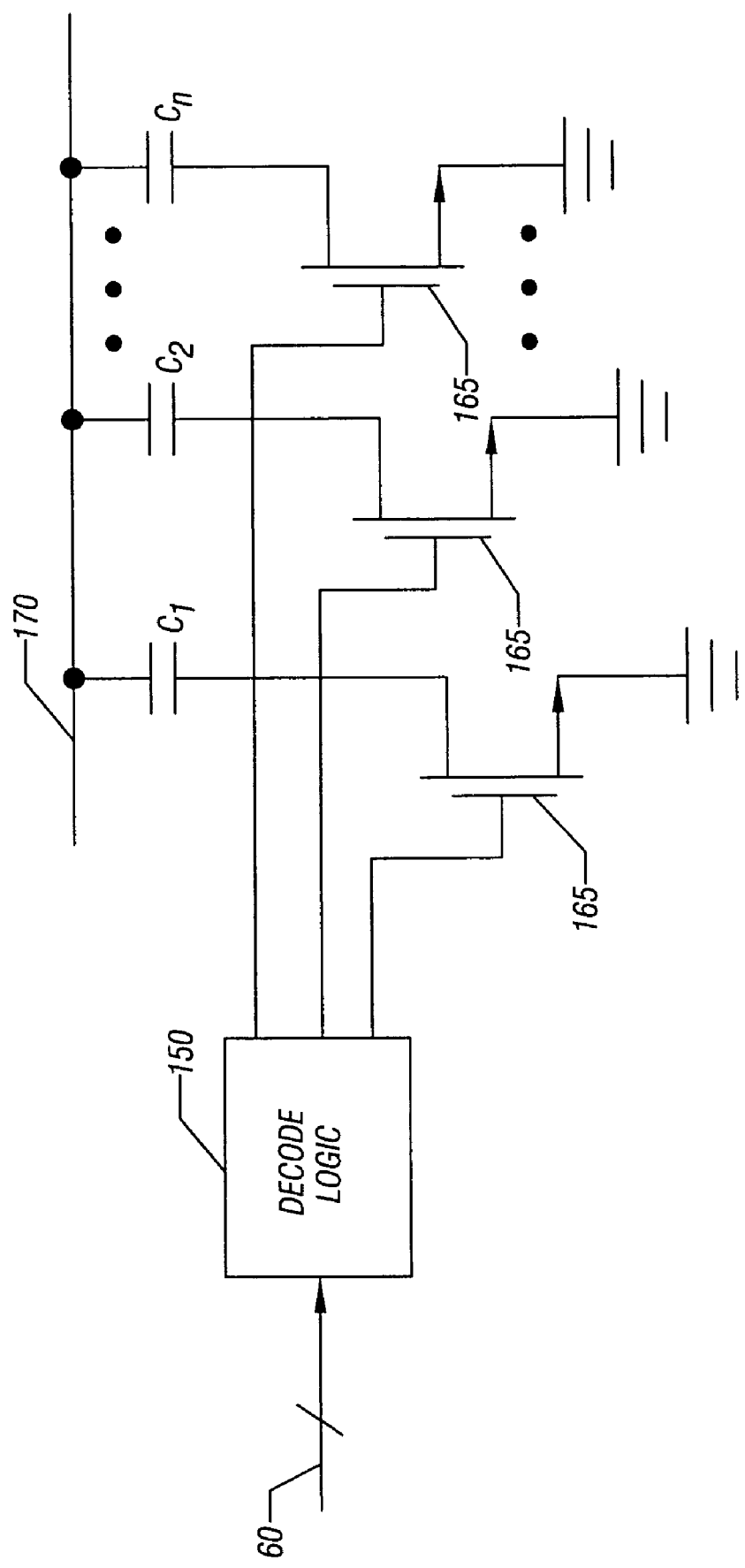
FIG. 3 is a block diagram of a portion of an analog clock circuit to control programmable load capacitors in accordance with an embodiment of the present invention.

Different manners of selecting capacitance levels for analog clock circuit 10 may be effected in different embodiments. In one embodiment, decode logic and switch devices may be used to select a desired capacitance. Referring now to FIG. 3, shown is a block diagram of a portion of analog clock circuit 10. As shown in FIG. 3, a decode logic 150 is coupled to a capacitor bank formed of a plurality of capacitors $C_1$ to $C_N$. While shown in the embodiment of FIG. 3 as including three individual capacitors, more or fewer such capacitors may be present in a given embodiment. As discussed above, in some embodiments the capacitors may be MOS capacitors. In other embodiments, the capacitors may be metal-insulator-metal (MIM) capacitors or metal finger capacitors. Decode logic 150 receives the incoming control signals 60 from digital portion 110. Based on the values of the incoming control signals 60, decode logic 150 generates switching signals to control switching of switching devices 165 to selectively couple associated capacitors $C_1$-$C_N$ of the capacitor bank between a capacitor array line 170 and ground. While not shown in FIG. 3, it is to be understood that line 170 may be coupled to node $V_1$ or $V_2$ of FIG. 1. Furthermore, it is to be understood that the oscillator's frequency may be controlled by the capacitor bank, and more specifically by selectively coupling to and isolating certain of the capacitors from a resonant tank of the oscillator in response to control signals 60. That is, selected ones of capacitors $C_1$-$C_N$ of the capacitor bank are coupled by capacitor array line 170 to the oscillator core. The capacitance that appears on line 170 controls the oscillation frequency of the oscillator core and therefore, controls the oscillation frequency of reference clock signal 50 (of FIG. 1).

For purposes of controlling the level of capacitance that appears on line 170, decode logic 150 and switching devices 165 selectively establish connections between the capacitors of the capacitor bank and ground. As shown in FIG. 3, switching devices 165 may be n-channel metal-oxide-semiconductor field-effect transistors (nMOSFETs), although other configurations are possible. Each nMOSFET 165 has a drain terminal coupled to a terminal of an associated capacitor. A source terminal is coupled to a ground potential, and each nMOSFET 165 has a gate terminal coupled to receive a selection signal from decode logic 150.

One terminal of each capacitor $C_1$-$C_N$ is coupled to line 170. In response to control signals 60, decode logic 150 and switching devices 165 selectively couple the capacitors $C_1$-$C_N$ to ground so that when a particular capacitor is coupled to ground, the capacitor becomes coupled to the oscillator and contributes to the capacitance of line 170. Otherwise, the capacitor remains isolated (i.e., "free floating") from the oscillator and does not contribute to the capacitance of line 170.

While shown with a particular configuration in the embodiment of FIG. 3, both decode logic 150 and switching devices 165 may take on various forms, depending on the particular embodiment. For example, decode logic 150 may be a thermometer-based decode logic that, in response to control signals 60 generates select signals to selectively control the activation of nMOSFETs 165, which selectively couple associated capacitors $C_1$-$C_N$ between line 170 and ground. In such an embodiment, the gate terminal of each nMOSFET 165 receives a binary selection signal from decode logic 150. Thus, the activation (via its gate terminal) of a particular nMOSFET 165 connects the associated capacitor to line 170, adding capacitance to line 170. This additional capacitance, in turn, changes the oscillation frequency. Likewise, the deactivation (turning off, for example) of a particular nMOSFET 165 (via its gate terminal) removes capacitance from line 170 and thus, affects the oscillation frequency in the opposite direction.

In some embodiments of the invention, capacitors $C_1$-$C_N$ may each have the same unit capacitance. In other words, decode logic 150 determines, based on the incoming control signals 60, how many of the capacitors are to be coupled to line 170 and activates the appropriate number of nMOSFETs 165. Of course, many other embodiments are possible and are within the scope of the appended claims. For example, instead of having a decode logic, switching devices (formed of nMOSFETs or other such devices) may directly receive a particular bit of control signals 60 (e.g., via a gate terminal of the MOSFET).

Furthermore, instead of each being associated with a capacitor of the same unit size, each switching device may selectively couple a binary-weighted capacitor to ground.

Due to such binary weighting, the more significant bits of control signals 60 control the coupling of the more significant capacitance to line 170.

While FIG. 3 shows a single capacitance array line 170, it is to be understood that mirrored capacitor banks may be present, one of which is coupled to node $V_1$ (of FIG. 1) and the other of which is coupled to node $V_2$ (also of FIG. 1). In these embodiments of the invention, changes to the capacitance $C_1$ may occur concurrently with changes to the capacitance $C_2$.

As discussed above, the supply voltage for a clock circuit may be provided by a main power supply or an auxiliary power supply. In an embodiment used in a wireless device, such as a cellular telephone, personal digital assistant (PDA), portable computer, or the like, the main power supply may be AC power or a battery pack, and the auxiliary power supply may be a small coin cell type battery, other battery supply, or large capacitor, to power the real time clock when the remainder of the system is powered down.

In various embodiments, power to a real time clock circuit may be automatically switched between a main power supply and an auxiliary power supply, based upon the state of the main power supply. That is, the real time clock may be powered by the main power supply when it is available, and instead be powered by the auxiliary power supply when the main power supply is unavailable.

Figure 4:
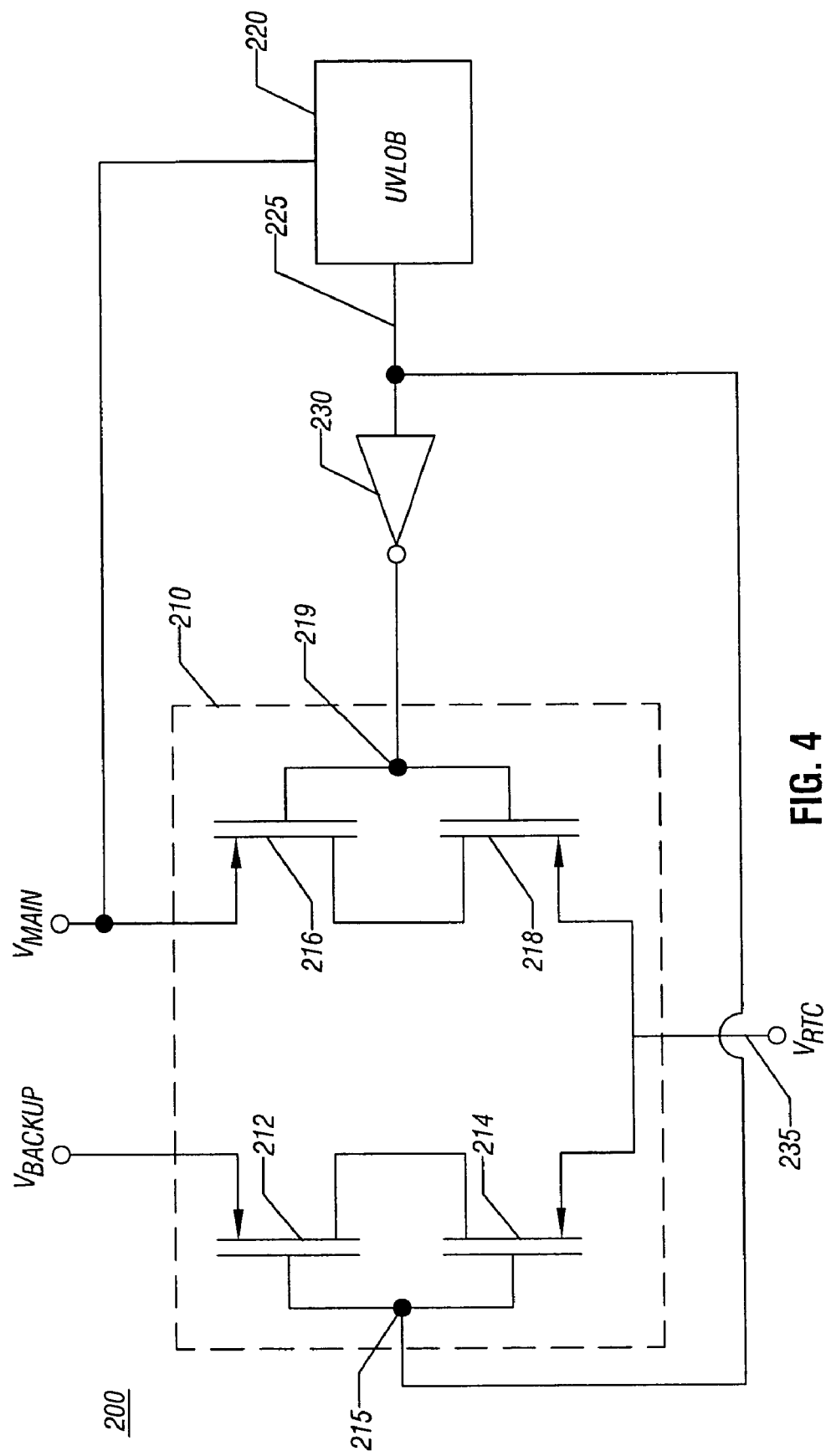
FIG. 4 is a block diagram of a power supply switching circuit in accordance with one embodiment of the present invention.

In one embodiment, switching circuitry may be provided to automatically switch the power supplies into or out of the real time clock circuit. Referring now to FIG. 4, shown is a block diagram of a switch circuit in accordance with one embodiment of the present invention. As shown in FIG. 4, a power supply switching circuit 200 includes a switch complex 210 that is coupled to receive both a main power supply voltage ($V_{Main}$) and an auxiliary power supply voltage ($V_{Backup}$), and provide a selected one of the power supply voltages as the supply voltage for the real time clock ($V_{RTC}$) via an output node 235. In one embodiment, $V_{Main}$ may be between approximately 2.7 volts and 3.0 volts, while $V_{Backup}$ may be between approximately 2.4 to 3.3 volts.

Power supply switching circuit 200 further includes an under voltage lockout block (UVLOB) circuit 220 that is coupled to receive the main power supply voltage and to generate an output signal based on the level of the main power supply voltage. That is, UVLOB circuit 220 includes a voltage detector to detect the voltage of the main power supply and provide a control signal based on its value. More specifically, UVLOB circuit 220 generates a control signal 225 that is coupled to an inverter 230 that in turn is coupled to a node 219 of switch complex 210. Control signal 225 is further coupled to a node 215 of switch complex 210.

Still referring to FIG. 4, switch complex 210 includes a first pair of transistors coupled to the auxiliary power supply voltage. Specifically, a first p-channel MOSFET (pMOSFET) 212 has a source terminal coupled to the auxiliary power supply and a drain terminal coupled to a drain terminal of a second pMOSFET 214, which has a source terminal coupled to output node 235 that provides the selected power supply voltage to the real time clock. The transistor pair including pMOSFETs 212 and 214 is controlled by control signal 225, which is coupled to node 215 that is coupled to the gate terminals of both pMOSFETs 212 and 214.

Similarly, switch complex 210 further includes a second pair of transistors coupled to the primary power supply voltage. Specifically, a third p-channel MOSFET (pMOSFET) 216 has a source terminal coupled to the primary power supply and a drain terminal coupled to a drain terminal of a fourth pMOSFET 218, which has a source terminal coupled to output node 235 that provides the selected power supply voltage to the real time clock. The transistor pair including pMOSFETs 216 and 218 is controlled by the inverted value of control signal 225, which is coupled to node 219 that is coupled to the gate terminals of both pMOSFETs 216 and 218. While shown with a particular configuration in FIG. 4, it is to be understood that switch complex 210 may be configured differently in other embodiments. For example, in some embodiments nMOSFETs may be used. In other embodiments an active current mirror or a form of gain stage may be implemented.

UVLOB circuit 220 is used to measure the voltage of the main power supply. When the voltage is greater than a predetermined threshold, which may be equal to the lowest voltage at which an associated real time clock can operate, UVLOB circuit 220 generates a logic high signal as control signal 225. In one embodiment, the threshold voltage may be approximately 2.4 volts. When control signal 225 is high, pMOSFETs 212 and 214 are gated off and pMOSFETs 216 and 218 are gated on, allowing the main power supply voltage to be coupled to node 235 and provided to the real time clock. In contrast, when the main power supply voltage is below the selected threshold, UVLOB circuit 220 generates a logic low value as control signal 225, switching on pMOSFETs 212 and 214 and turning off pMOSFETs 216 and 218. Accordingly, the auxiliary power supply voltage is coupled to node 235 to operate the real time clock. With the configuration shown in FIG. 4, switch complex 210 can couple the auxiliary power supply to node 235, even when the main power supply is powered off. Thus in systems in which switching circuit 200 is coupled to provide power to a real time clock circuit, such power can be provided even when a remaining portion of the system is powered off.

In such manner, switching circuit 200 can automatically switch the real time clock to use either a main power supply or an auxiliary power supply. This may conserve the auxiliary power supply, in some embodiments. While described as being connected to an RTC circuit, it is to be understood that a power supply switch in accordance with an embodiment of the present invention can be used to switch between power supplies for any type of circuitry.

Figure 5:
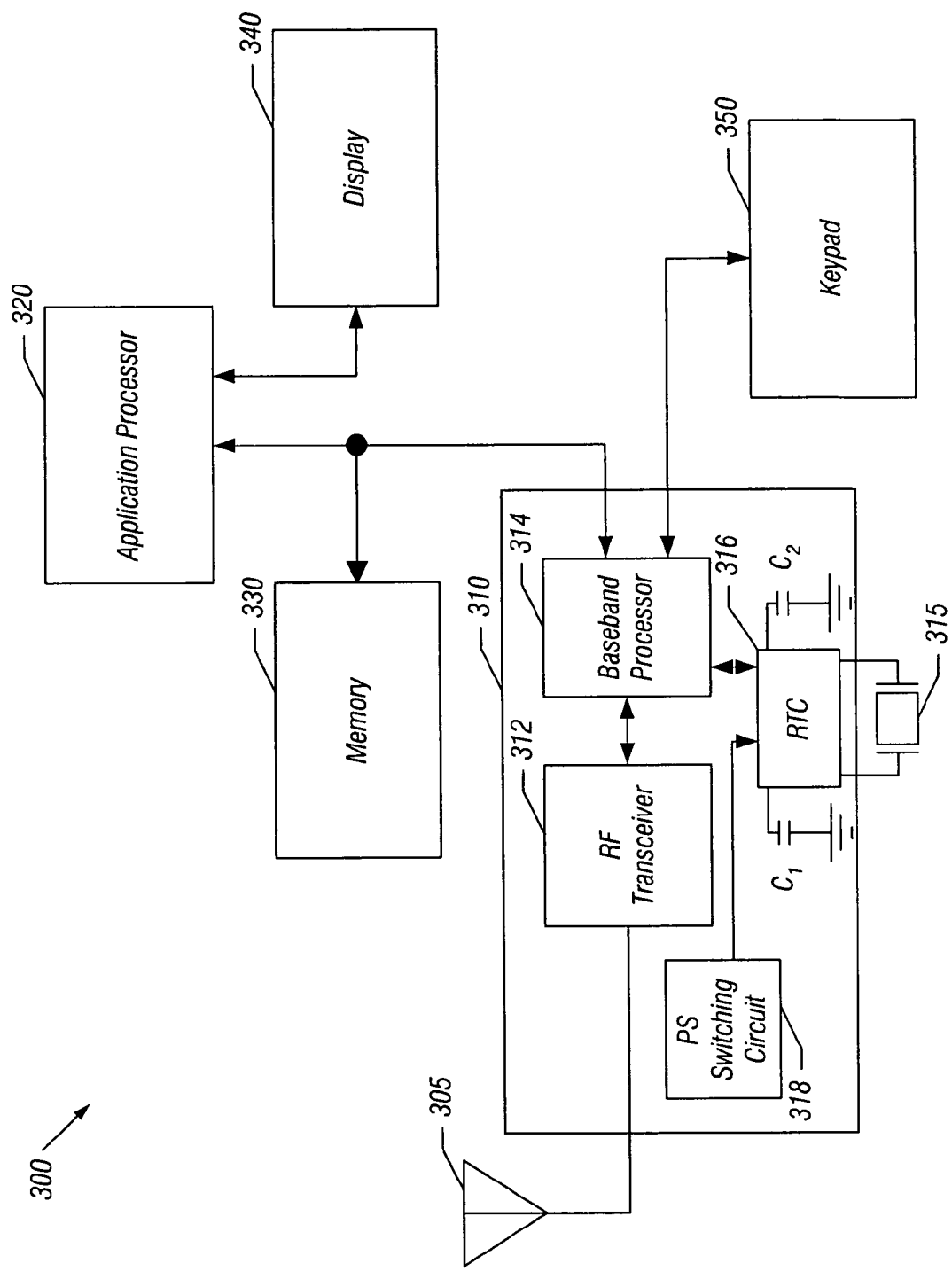
FIG. 5 is a block diagram of a system in accordance with one embodiment of the present invention.

Referring now to FIG. 5, shown is a block diagram of a system in accordance with one embodiment of the present invention. As shown in FIG. 5, system 300 may be a wireless device, such as a cellular telephone, PDA, portable computer or the like. An antenna 305 is present to receive and transmit radio frequency (RF) signals. Antenna 305 may receive different bands of incoming RF signals using an antenna switch. For example, a quad-band receiver may be adapted to receive global system for mobile (GSM) communications, enhanced GSM (EGSM), digital cellular system (DCS) and personal communication system (PCS) signals, although the scope of the present invention is not so limited. In other embodiments, antenna 305 may be adapted for use in a general packet radio service (GPRS) device, a satellite tuner, or a wireless local area network (WLAN) device, for example.

Incoming RF signals are provided to a transceiver 310 which may be a single chip transceiver including both RF components and baseband components. Transceiver 310 may be formed using a complementary metal-oxide-semiconductor (CMOS) process, in some embodiments. Thus as shown in FIG. 5, transceiver 310 includes an RF transceiver portion 312 and a baseband processor 314. RF transceiver portion 312 may include receive and transmit portions and may be adapted to provide frequency conversion between the RF spectrum and a baseband. Baseband signals are then provided to a baseband processor 314 for further processing.

As further shown in FIG. 5, transceiver 310 further includes a real time clock 316 that is used to provide a reference clock signal to baseband processor 314 based on control signals received from baseband processor 314. Furthermore, while not shown in FIG. 5, it is to be understood that the reference clock signal (or processed variations thereof) may be provided to other circuitry within system 300. RTC 316 may include on-chip load capacitors $C_1$ and $C_2$ which, as described above, may be programmable so that the desired reference clock signal may be generated using any one of a number of different crystals. While shown in the embodiment of FIG. 5 as being including within transceiver 310, in other embodiments RTC 316 may be located off chip. In yet other embodiments, RTC 316 may be on chip, while load capacitors $C_1$ and $C_2$ may be located off chip. In the embodiment of FIG. 5, a crystal 315 is coupled to RTC 316.

Still referring to FIG. 5, transceiver 310 may further include a power supply (PS) switching circuit 318. PS switching circuit 318, which may be formed of switching circuit 200 of FIG. 4, may provide a selected one of a main power supply and an auxiliary power supply to RTC 316. Further, while not shown in FIG. 5, it is to be understood that PS switching circuit 318 may further provide the selected supply voltage to other portions of transceiver 310, in addition to other parts of system 300. While shown in FIG. 5 as being included within transceiver 310, it is to be understood that the scope of the present invention is not so limited, and in other embodiments PS switching circuit 318 may be off chip.

After processing signals received from RF transceiver 312, baseband processor 314 may provide such signals to various locations within system 300 including, for example, an application processor 320 and a memory 330. Application processor 320 may be a microprocessor, such as a central processing unit (CPU) to control operation of system 300 and further handle processing of application programs, such as personal information management (PIM) programs, email programs, downloaded games, and the like. Memory 330 may include different memory components, such as a flash memory and a read only memory (ROM), although the scope of the present invention is not so limited. Additionally, a display 340 is shown coupled to application processor 320 to provide display of information associated with telephone calls and application programs, for example. Furthermore, a keypad 350 may be present in system 300 to receive user input.

Although the description makes reference to specific components of system 300, it is contemplated that numerous modification and variations of the described and illustrated embodiments may be possible. Furthermore, while not shown in FIG. 5, it is to be understood that a primary and auxiliary power supply may be present, both of which may be coupled to power supply switching circuit 318 in accordance with an embodiment of the present invention to automatically switch a supply voltage to RTC 316, based on a voltage level of the primary power supply.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   storing an initial value for load capacitors of an oscillator of a real time clock of a first integrated circuit in a register of a digital portion of the real time clock;
   providing the initial value to control the load capacitors while a remaining portion of the first integrated circuit is powered down;
   supplying a reference clock from the oscillator to a baseband portion of the first integrated circuit using the initial value to enable a power on process to be performed; and
   providing an operating value to control the load capacitors, the operating value stored in the register and corresponding to a value different from the initial value, the operating value received from the baseband portion of the first integrated circuit executing startup software after it is powered up.

2. The method of claim 1, further comprising providing the initial value from the register, wherein the register is reset by a reset signal generated after a predetermined delay from receipt of a supply voltage in the first integrated circuit.

3. The method of claim 1, wherein the load capacitors are on the first integrated circuit.

4. A method comprising:
   providing an initial value for load capacitors of an oscillator of a real time clock while a remaining portion of an associated integrated circuit is powered down, from a register of a digital portion of the real time clock;
   supplying a reference clock from the oscillator to the digital portion and from the digital portion to a baseband portion of the associated integrated circuit using the initial value; and
   setting an operating value for the load capacitors in the register based on a desired frequency of the reference clock using the baseband portion of the associated integrated circuit executing a basic input/output system (BIOS).

5. The method of claim 4, wherein the oscillator comprises an analog portion of the real time clock.

6. The method of claim 5, further comprising automatically switching from a backup power supply to a main power supply for the real time clock based on a voltage of the main power supply.

7. An integrated circuit comprising:
   a transceiver of the integrated circuit to transmit and receive radio frequency (RF) signals;
   a baseband processor of the integrated circuit to process baseband signals provided from the transceiver;
   a real time clock of the integrated circuit, the real time clock including:
      an analog circuit portion, the analog circuit portion including programmable load capacitors;
      a digital circuit portion, the digital circuit portion to provide an initial control signal to the programmable load capacitors upon power up of the real time clock and an operating control signal to the programmable load capacitors after receipt of a reference clock from the analog circuit portion; and
      a reset circuit to receive a power supply voltage and to generate a reset signal after a predetermined delay from receipt of the power supply voltage.

8. The integrated circuit of claim 7, wherein the programmable load capacitors are on the integrated circuit.

9. The integrated circuit of claim 7, wherein the digital circuit portion comprises a storage to store the initial control signal, the storage to provide the initial control signal to the programmable load capacitors upon receipt of the reset signal.

10. The integrated circuit of claim 7, wherein the digital circuit portion is to provide the reference clock to the baseband processor of the integrated circuit.

11. The integrated circuit of claim 10, wherein the baseband processor is to generate the operating control signal based on a desired frequency of the reference clock.

12. A wireless system comprising:

a transceiver including a radio frequency (RF) portion and a baseband portion, the transceiver further including a real time clock having an analog clock circuit including an oscillator having a controllable load capacitance and a digital clock circuit including at least one register to store an initial value for control of the load capacitance while a remaining portion of the transceiver is powered down, wherein the oscillator is to supply a reference clock to the digital clock circuit using the initial value, the digital clock circuit is to supply the reference clock to the baseband portion after it is powered up, and the baseband portion is to thereafter provide an operating value for control of the load capacitance to the register based on a desired frequency of the reference clock; and an antenna coupled to the transceiver.

13. The system of claim 12, wherein the transceiver includes a power supply circuit to provide a supply voltage to the real time clock from a primary power supply or an auxiliary power supply based on a level of the primary power supply.

14. The system of claim 13, wherein the real time clock further includes a reset circuit to generate a signal to cause the register to be set to the initial value.

15. The system of claim 14, wherein the reset circuit is to delay the signal for a first time from receipt of the supply voltage.

16. The system of claim 15, wherein the first time is to enable the register to receive the supply voltage.

* * * * *